US006970368B1

(12) United States Patent
Bautista, Jr. et al.

(10) Patent No.: US 6,970,368 B1
(45) Date of Patent: Nov. 29, 2005

(54) CAM (CONTENT ADDRESSABLE MEMORY) CELLS AS PART OF CORE ARRAY IN FLASH MEMORY DEVICE

(75) Inventors: Edward V. Bautista, Jr., Sunnyvale, CA (US); Ken Cheong Cheah, Penang (MY)

(73) Assignee: Advanced Micro Devices, Inc., Sunnyvale, CA (US)

( * ) Notice: Subject to any disclaimer, the term of this patent is extended or adjusted under 35 U.S.C. 154(b) by 127 days.

(21) Appl. No.: 10/650,049

(22) Filed: Aug. 26, 2003

(51) Int. Cl.[7] ............................................. G11C 15/00
(52) U.S. Cl. .................................... 365/49; 365/185.33
(58) Field of Search ............................. 365/185.33, 49

(56) References Cited

U.S. PATENT DOCUMENTS 6,631,086 B1 * 10/2003 Bill et al. ............... 365/185.09
6,665,214 B1 * 12/2003 Cheah et al. .......... 365/185.22
6,707,718 B1 * 3/2004 Halim et al. ........... 365/185.22

* cited by examiner

*Primary Examiner*—M. Tran
(74) *Attorney, Agent, or Firm*—Monica H. Choi

(57) ABSTRACT

In a method and system for providing a CAM (content addressable memory) cell of a flash memory device, a respective core flash memory cell to be used as the CAM cell is fabricated as part of a core array of the flash memory device. In addition, the respective core flash memory cell is accessed from the core array as the CAM cell for a CAM function within the flash memory device. Components used for supporting operation of the core array are also used for accessing the core flash memory cells of the additional sector for such CAM functionality. Thus, CAM functionality is provided with a minimized number of components and with minimized area of the die of the flash memory device. In addition, because the CAM cells are implemented as core flash memory cells of the core array, the CAM cells may reliably undergo more numerous programming and erasing cycles.

35 Claims, 12 Drawing Sheets

US 6,970,368 B1

CAM (CONTENT ADDRESSABLE MEMORY) CELLS AS PART OF CORE ARRAY IN FLASH MEMORY DEVICE

TECHNICAL FIELD

The present invention relates generally to flash memory technology, and more particularly, to a method and system for providing CAM (content addressable memory) cells as part of the core array in a flash memory device.

BACKGROUND OF THE INVENTION

Referring to FIG. 1, a flash memory cell 100 of a flash memory device includes a tunnel dielectric structure 102 typically comprised of silicon dioxide ($SiO_2$) or nitrided oxide as known to one of ordinary skill in the art of integrated circuit fabrication. The tunnel dielectric structure 102 is disposed on a semiconductor substrate or a p-well 103. In addition, a floating gate structure 104, comprised of a conductive material such as polysilicon for example, is disposed over the tunnel dielectric structure 102. A dielectric structure 106, typically comprised of silicon dioxide ($SiO_2$), is disposed over the floating gate structure 104. A control gate structure 108, comprised of a conductive material, is disposed over the dielectric structure 106.

A drain bit line junction 110 that is doped with a junction dopant, such as arsenic (As) or phosphorous (P) for example, is formed within an active device area 112 of the semiconductor substrate or p-well 103 toward a left sidewall of the floating gate structure 104 in FIG. 1. A source bit line junction 114 that is doped with the junction dopant is formed within the active device area 112 of the semiconductor substrate or p-well 106 toward a right sidewall of the floating gate structure 104 of FIG. 1.

During the program or erase operations of the flash memory cell 100 of FIG. 1, charge carriers are injected into or tunneled out of the floating gate structure 104. Such variation of the amount of charge carriers within the floating gate structure 104 alters the threshold voltage of the flash memory cell 100, as known to one of ordinary skill in the art of flash memory technology. For example, when electrons are the charge carriers that are injected into the floating gate structure 104, the threshold voltage increases. Alternatively, when electrons are the charge carriers that are tunneled out of the floating gate structure 104, the threshold voltage decreases. These two conditions are used as the two states for storing digital information within the flash memory cell 100, as known to one of ordinary skill in the art of flash memory technology.

For example, during programming of the flash memory cell 100 that is an N-channel flash memory cell, electrons are injected into the floating gate structure 104 to increase the threshold voltage of the flash memory cell 100. Alternatively, during erasing of the N-channel flash memory cell 100, electrons are pulled out of the floating gate structure 104 to the substrate or p-well 103 to decrease the threshold voltage of the flash memory cell 100.

FIG. 2 illustrates a circuit diagram representation of the flash memory cell 100 of FIG. 1 including a control gate terminal 120 coupled to the control gate structure 108, a drain terminal 122 coupled to the drain bit line junction 110, a source terminal 124 coupled to the source bit line junction 114, and a substrate or p-well terminal 126 coupled to the substrate or p-well 103. FIG. 3 illustrates an electrically erasable and programmable memory device 130 comprised of an array of flash memory cells, as known to one of ordinary skill in the art of flash memory technology. Referring to FIG. 3, the array of flash memory cells 130 includes rows and columns of flash memory cells with each flash memory cell having similar structure to the flash memory cell 100 of FIGS. 1 and 2.

The array of flash memory cells 130 of FIG. 3 is illustrated with two columns and two rows of flash memory cells for simplicity and clarity of illustration. However, a typical array of flash memory cells comprising an electrically erasable and programmable memory device has more numerous rows and columns of flash memory cells.

Further referring to FIG. 3, in the array of flash memory cells 130 comprising an electrically erasable and programmable memory device, the control gate terminals of all flash memory cells in a row of the array are coupled together to form a respective word line for that row. In FIG. 3, the control gate terminals of all flash memory cells in the first row are coupled together to form a first word line 132, and the control gate terminals of all flash memory cells in the second row are coupled together to form a second word line 134.

In addition, the drain terminals of all flash memory cells in a column are coupled together to form a respective bit line for that column. In FIG. 3, the drain terminals of all flash memory cells in the first column are coupled together to form a first bit line 136, and the drain terminals of all flash memory cells in the second column are coupled together to form a second bit line 138. Further referring to FIG. 3, the source terminal of all flash memory cells of the array 130 are coupled together to a source voltage $V_{ss}$, and the substrate or p-well terminal of all flash memory cells of the array 130 are coupled together to a substrate voltage $V_{SUB}$.

Referring to FIG. 4, a flash memory device comprised of an array of flash memory cells as illustrated in FIG. 3 for example is fabricated on a semiconductor die of a semiconductor wafer 140. A plurality of semiconductor dies is manufactured on the semiconductor wafer 140. Each square area on the semiconductor wafer 140 of FIG. 4 represents one semiconductor die. More numerous semiconductor dies are typically fabricated on a semiconductor wafer than shown in FIG. 4 for clarity of illustration.

FIG. 5 illustrates an example semiconductor die 142 of FIG. 4 having a respective flash memory device comprised of a core array of core flash memory cells 144, such as the array 130 of FIG. 3 for example. In addition, the semiconductor die 142 includes periphery logic 146 for supporting operation of the core array 144, as known to one of ordinary skill in the art of flash memory technology.

CAM (content addressable memory) cells 148 are used within the periphery logic 146 for supporting operation of the core array 144, as known to one of ordinary skill in the art of flash memory technology. The CAM cells 148 typically are non-volatile memory cells, each implemented with a cross-section similar to the flash memory cell 100 of FIG. 1 for example.

One example application of the CAM cells 148 is for WP (write protect) functionality. The present invention is described in reference to WPCAM (write protect content addressable memory) cells used for WP functionality. However, the present invention may be used for implementing CAM (content addressable memory) cells used for other functionalities within the flash memory device, as would be apparent to one of ordinary skill in the art of flash memory technology from the description herein. Referring to FIG. 8, for WP functionality, a respective WPCAM cell is formed for each sector of the core array 144. Typically, the flash memory cells within the core array 144 are organized into sectors, as known to one of ordinary skill in the art of flash memory technology. Each of the sectors of the core array 144 is comprised of a corresponding group of word lines but share the same bit lines.

In FIG. 8, a first WPCAM cell 152 is formed for a first sector 162, a second WPCAM cell 154 is formed for a second sector 164, a third WPCAM cell 156 is formed for a third sector 166, and a fourth WPCAM cell 158 is formed for a fourth sector 168. The core array 144 is typically comprised of more numerous sectors, but four sectors and four WPCAM cells are illustrated in FIG. 8 for simplicity and clarity of illustration and description.

For WP functionality, each of the WPCAM cells 152, 154, 156, and 158 is programmed or erased to indicate whether a corresponding one of the sectors 162, 164, 166, or 168 is write protected. If a sector is write protected, the flash memory cells within that sector cannot be programmed or erased, but may be read. For example, when any of the sectors 162, 164, 166, or 168 is write protected, the corresponding one of the WPCAM cells 152, 154, 156, and 158 is programmed, and is erased otherwise. Thus, for determining whether any of the sectors 162, 164, 166, or 168 is write protected, the programmed or erased state is read from the corresponding one of the WPCAM cells 152, 154, 156, and 158.

FIG. 6 illustrates a block diagram of components of the periphery logic 146 for supporting such WP functionality with the WPCAM cells 148. A WPCAM margin circuitry 153 generates a gate voltage to be applied on a gate of a WPCAM cell during program or erase margining of one of the WPCAM cells 152, 154, 156, and 158. Program and erase margining of a CAM cell is known to one of ordinary skill in the art of flash memory technology.

In addition, a WPCAM gate voltage booster 155 generates a gate voltage to be applied on a gate of a WPCAM cell during reading of the programmed or erased state of one of the WPCAM cells 152, 154, 156, and 158. Furthermore, a WPCAM program circuitry 157 and a WPCAM erase circuitry 159 each generate a gate voltage to be applied on a gate of a WPCAM cell during programming or erasing, respectively, of one of the WPCAM cells 152, 154, 156, and 158.

A WPCAM gate voltage switch 160 selects a gate voltage from one of the gate voltage sources 153, 155, 157, and 159 depending on the current WPCAM operation to be performed as indicated by WP operation mode signals derived from external data as input by a user. The user inputs data to indicate whether a WPCAM cell is desired to be margined, read, programmed, or erased.

The address of one of the WPCAM cells 152, 154, 156, and 158 of interest is indicated from the sector address within an address sequencer 161. FIG. 9 shows an example address sequencer 161 including a first group of seven bit buffers A[6:0] 167 for indicating a Y-address of a flash memory cell within the core array 144, a second group of eight bit buffers A[14:7] 169 for indicating an X-address of a flash memory cell within the core array 144, and a third group of five bit buffers A[19:15] 170 for indicating a sector address of a flash memory cell within the core array 144.

Since each of the WPCAM cells 152, 154, 156, and 158 corresponds to one of the sectors of the core array 144, the sector address bits A[19:15] are used by a WPCAM location decoder 172 for selecting one of the WPCAM cells 152, 154, 156, and 158 of interest. The gate voltage as selected by the WPCAM gate voltage switch 160 is applied on the gate of such a WPCAM cell of interest as selected by the WPCAM location decoder 172. In addition, a WPCAM drain voltage generator 174 generates a drain voltage to be applied on a drain of such a WPCAM cell of interest for a programming or erasing operation. The WPCAM drain voltage generator 174 generates a proper level of such a drain voltage depending on the current WPCAM operation indicated by the WP operation mode signals (i.e., for programming or erasing).

With the gate voltage for reading applied on the WPCAM cell of interest from the WPCAM gate booster 155, the drain of the WPCAM cell of interest is coupled to a weak pull-up circuitry 177. The drain is pulled down to the ground voltage to indicate an erased WPCAM cell or is pulled up to a positive rail voltage to indicate a programmed WPCAM cell. A WPSB (write protect state bit) indicates such a programmed or erased state of the WPCAM cell of interest. If the WPSB indicates that the WPCAM cell of interest is programmed, the back-end state machine 176 disables programming or erasing of any flash memory cell within a sector corresponding to the WPCAM cell of interest. When the WPCAM cell of interest is programmed, the sector corresponding to the WPCAM cell of interest is write-protected.

On the other hand, if the WPSB indicates that the WPCAM cell of interest is erased, the back-end state machine generates a control signal for programming or erasing a flash memory cell within the sector corresponding to the WPCAM cell of interest. In that case, the sector corresponding to the WPCAM cell of interest is not write-protected.

Such WPCAM cells 148 and such write-protect functionality are known to one of ordinary skill in the art of flash memory technology. In addition, implementation of the components 148, 153, 155, 157, 159, 160, 161, 172, 174, 176, and 177 of FIG. 6 are known to one of ordinary skill in the art of flash memory technology.

FIG. 7 illustrates additional components of the periphery logic 146 for supporting use of the core array of flash memory cells 144. A program circuitry 182 generates programming voltages to be applied on the gate and the drain of a core flash memory cell within the core array 144. Similarly, an erase circuitry 184 generates erasing voltages to be applied on the gate and the drain of a core flash memory cell within the core array 144. In addition, a read/verify circuitry 186 generates the reading voltage to be applied on the gate of a core flash memory cell within the core array 144. Furthermore, the read/verify circuitry 186 couples the drain of the core flash memory cell to a cascode sense amplifier for determining the programmed or erased state of the core flash memory cell.

The address sequencer 161 indicates the address of a core flash memory cell of interest within the core array 144 to be programmed, erased, or read. Referring to FIGS. 7 and 9, a Y-decoder 190 decodes the Y-address bits A[6:0] from the address sequencer 161 for selecting the bit-line of the core flash memory cell of interest within the core array 144. Similarly, an X-decoder 188 decodes the X-address bits A[14:7] from the address sequencer 161 for selecting the word-line of the core flash memory cell of interest within the core array 144.

Referring to FIGS. 7 and 8, the X-decoder 188 includes a plurality of X-decoder units, each for selecting a word-line for a core flash memory cell within a respective sector. In FIG. 8, a first X-decoder unit 192 selects a word-line for a core flash memory cell within the first sector 162, and a second X-decoder unit 194 selects a word-line for a core flash memory cell within the second sector 164. Similarly, a third X-decoder unit 196 selects a word-line for a core flash memory cell within the third sector 166, and a fourth X-decoder unit 198 selects a word-line for a core flash memory cell within the fourth sector 168. On the other hand, the Y-decoder 190 selects the bit line for a core flash memory cell in any of the sectors 162, 164, 166, and 168 that share the bit lines.

Referring to FIG. 7, each of a plurality of sector switches 200 gates a negative erasing gate voltage from the erase circuitry for a respective one of the sectors 162, 164, 166, and 168. In addition, a state decoder 202 decodes data from I/O pads to determine the mode of operation to be performed on the core array 144.

If such data from the I/O pads indicates programming a core flash memory cell of interest within the core array 144, the back-end state machine 176 generates a program pulse to control the program circuitry 182 to generate programming voltages. The address sequencer 161 indicates the address of the core flash memory cell of interest within the core array 144 to be programmed. Such an address may be input into the address sequencer via address pads by an external user.

The X-decoder 188 decodes the X-address bits A[14:7] from the address sequencer 161 and applies the programming gate voltage from the program circuitry 182 on a selected word line for the core flash memory cell of interest within the core array 144. Similarly, the Y-decoder 190 decodes the Y-address bits A[6:0] from the address sequencer 161 and applies the programming drain voltage from the program circuitry 182 on a selected bit line for the core flash memory cell of interest. In this manner, the core flash memory cell of interest within the core array 144 is programmed.

On the other hand, if the data from the I/O pads into the state decoder 202 indicates erasing a sector of core flash memory cells of interest within the core array 144, the back-end state machine 176 generates an erase pulse to control the erase circuitry 184 to generate erasing voltages. For the erasing operation, core flash memory cells are erased a sector at a time. The address sequencer 161 indicates the sector address of the sector of interest within the core array 144 to be erased. Such a sector address may be input into the address sequencer via address pads by an external user.

The X-decoder 188 applies the erasing gate voltage from the erase circuitry 184 on the word lines for the selected sector of interest within the core array 144. Similarly, the Y-decoder 190 applies the erasing drain voltage from the erase circuitry 184 on the bit lines for the sector of interest. In this manner, the core flash memory cells within the sector of interest are erased.

In addition, for reading the core flash memory cell of interest within the core array 144, the X-decoder 188 applies the reading gate voltage from the read/verify circuitry 186 on a selected word line for the core flash memory cell of interest. Similarly, the Y-decoder 190 couples a cascode sense amplifier within the read/verify circuitry 186 to a selected bit line for the core flash memory cell of interest. The cascode sense amplifier within the read/verify circuitry 186 then determines the programmed or erased state of the core flash memory cell of interest for the back-end state machine 176.

Such programming, erasing, and reading operations for the flash memory cells within the core array 144 are known to one of ordinary skill in the art of flash memory technology. In addition, implementation of the components 182, 184, 186, 188, 190, 200, and 202 of FIG. 7 are known to one of ordinary skill in the art of flash memory technology.

Referring to FIGS. 6 and 7, in the prior art, the WPCAM cells 148 are fabricated as separate flash memory cells from the core array 144. In the prior art, the size dimensions and the material comprising the structures of the flash memory cells 152, 154, 156, 158 of the WPCAM cells 148 are designed to be different from the core flash memory cells within the core array 144.

The WPCAM cells 148 are used for storing write protect information for each sector of the core array 144. On the other hand, the flash memory cells within the core array 144 are used with numerous cycles of programming and erasing. Thus, the size dimensions and the material of the WPCAM cells 148 are designed for optimizing charge retention, whereas, the size dimensions and the material of the flash memory cells within the core array 144 are designed for optimized reliability for millions of cycles of programming and erasing.

Because of such differences between the WPCAM cells 148 and the flash memory cells within the core array 144, separate circuitry within the periphery logic is used for supporting operation of the WPCAM cells 148 and the flash memory cells within the core array 144. The components 153, 155, 157, 159, 161, 172, 174, and 177 of FIG. 6 are formed within the periphery logic 146 for supporting operation of the WPCAM cells 148, whereas, the components 182, 184, 186, 188, 190, 200, and 202 of FIG. 7 are formed within the periphery logic 146 for supporting operation of the flash memory cells within the core array 144.

Such numerous components of the prior art for supporting operation of the WPCAM cells 148 are disadvantageous because of added complexity and area occupied by the flash memory device. In addition, the additional WPCAM cells themselves that are designed to be relatively large for optimized charge retention occupy additional area. Nevertheless, WPCAM cells for WP functionality are desired for the flash memory device.

Thus, a mechanism is desired for providing CAM cells within the flash memory device with a minimized number of components for supporting operation of the CAM cells and with minimized area for the die of the flash memory device.

SUMMARY OF THE INVENTION

Accordingly, in a general aspect of the present invention, CAM cells are implemented as part of the core array of the flash memory device such that components used for accessing flash memory cells within the core array are also used for accessing the CAM cells.

In one embodiment of the present invention, in a method and system for providing a CAM (content addressable memory) cell of a flash memory device, a respective core flash memory cell to be used as the CAM cell is fabricated as part of a core array of the flash memory device. In addition, the respective core flash memory cell is accessed from the core array as the CAM cell for a CAM function within the flash memory device.

In another embodiment of the present invention, an additional sector is fabricated as part of the core array of the flash memory device to include the respective core flash memory cell used as the CAM cell. In a further embodiment of the present invention, each of a plurality of core flash memory cells within the additional sector is programmed or erased to indicate whether a corresponding one of a plurality of other sectors is write-protected for write protect (WP) functionality. Components used for supporting operation of the core array are also used for accessing the core flash memory cells of the additional sector for such WP functionality.

In this manner, CAM functionality is provided with a minimized number of components and with minimized area of the die of the flash memory device. In addition, because the CAM cells are implemented as core flash memory cells of the core array, the CAM cells may reliably undergo more numerous programming and erasing cycles. Traditional CAM cells that are optimized for charge retention typically reliably support approximately one hundred programming and erasing cycles of such CAM cells. However, because core flash memory cells of the core array are optimized for numerous programming and erasing cycles (such as millions of programming and erasing cycles), the CAM cells that are implemented as core flash memory cells of the core array may reliably undergo more numerous programming and erasing cycles.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, 7, 8, 9, 10, 11, 12, 13, 14, 15, 16, 17, and 18 refer to elements having similar structure and function.

DETAILED DESCRIPTION

The present invention is described in reference to WPCAM (write protect content addressable memory) cells used for WP (write protect) functionality. However, the present invention may be used for implementing CAM (content addressable memory) cells used for other CAM functionalities within the flash memory device, as would be apparent to one of ordinary skill in the art of flash memory technology from the description herein.

Figure 1:
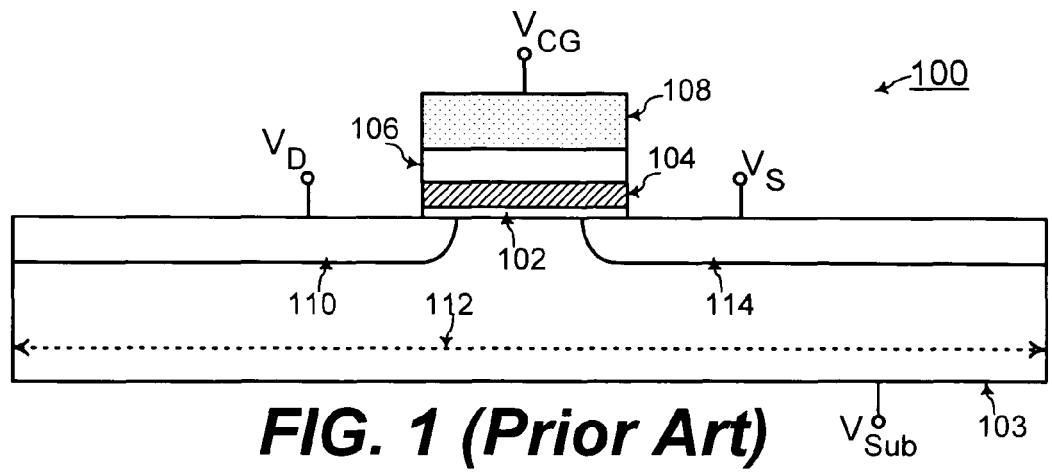
FIG. 1 shows a cross-sectional view of a flash memory cell, according to the prior art.
Figure 2:
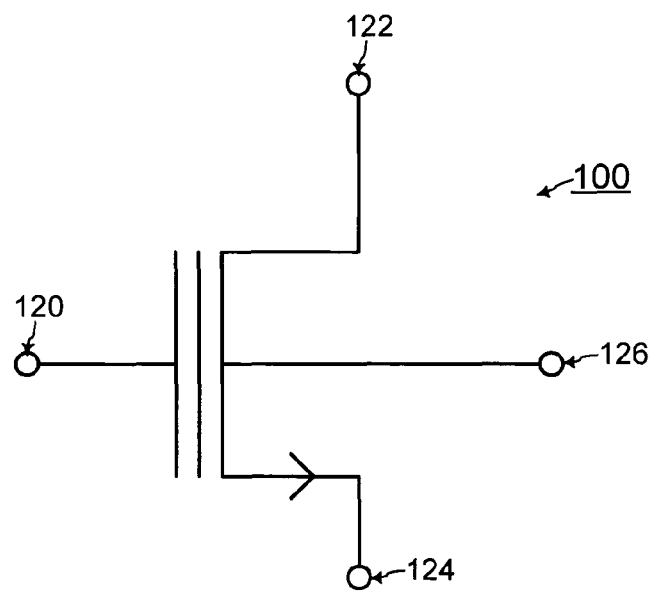
FIG. 2 shows a circuit diagram representation of the flash memory cell of FIG. 1, according to the prior art.
Figure 3:
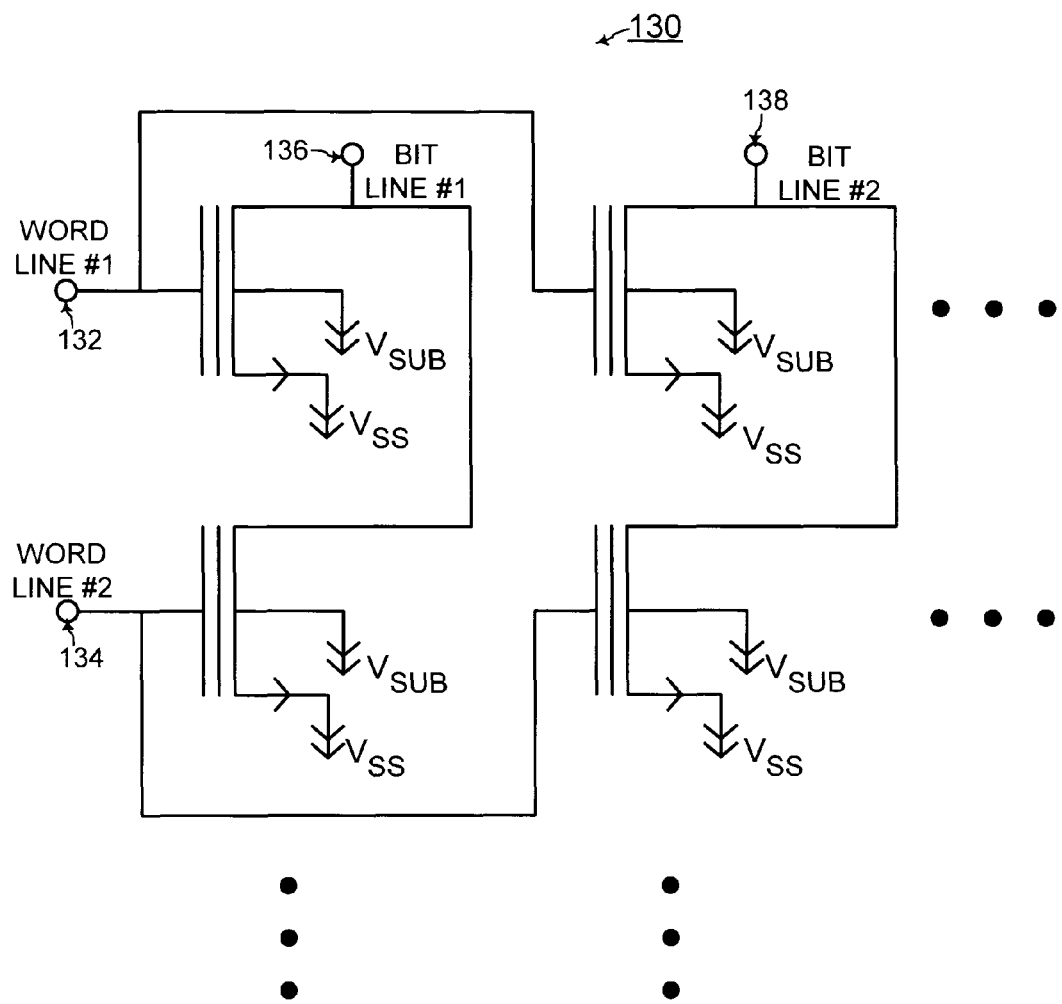
FIG. 3 shows an array of flash memory cells comprising a flash memory device, according to the prior art.
Figure 4:
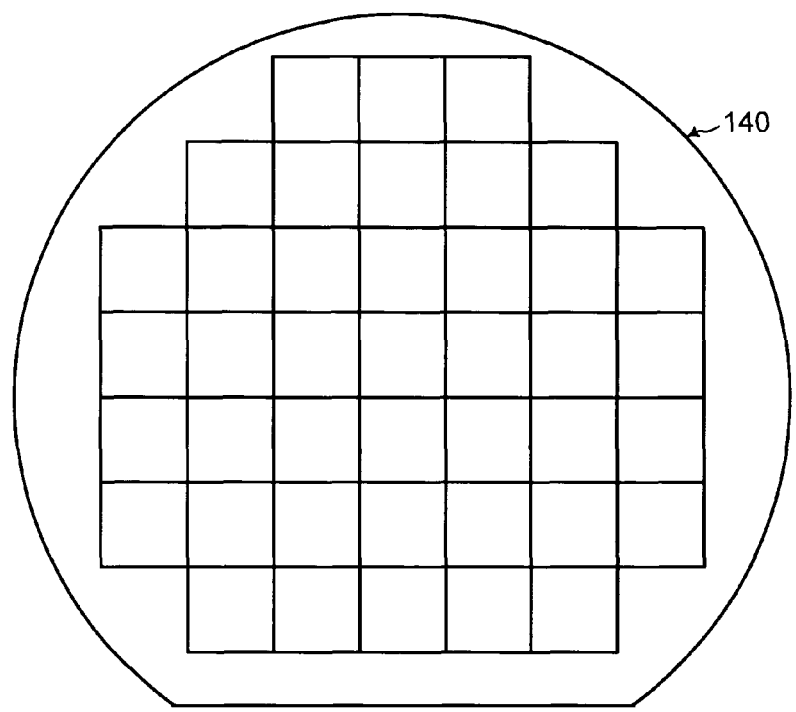
FIG. 4 shows a semiconductor wafer having a plurality of semiconductor dies with each semiconductor die having a respective array of flash memory cells fabricated thereon, according to the prior art.
Figure 5:
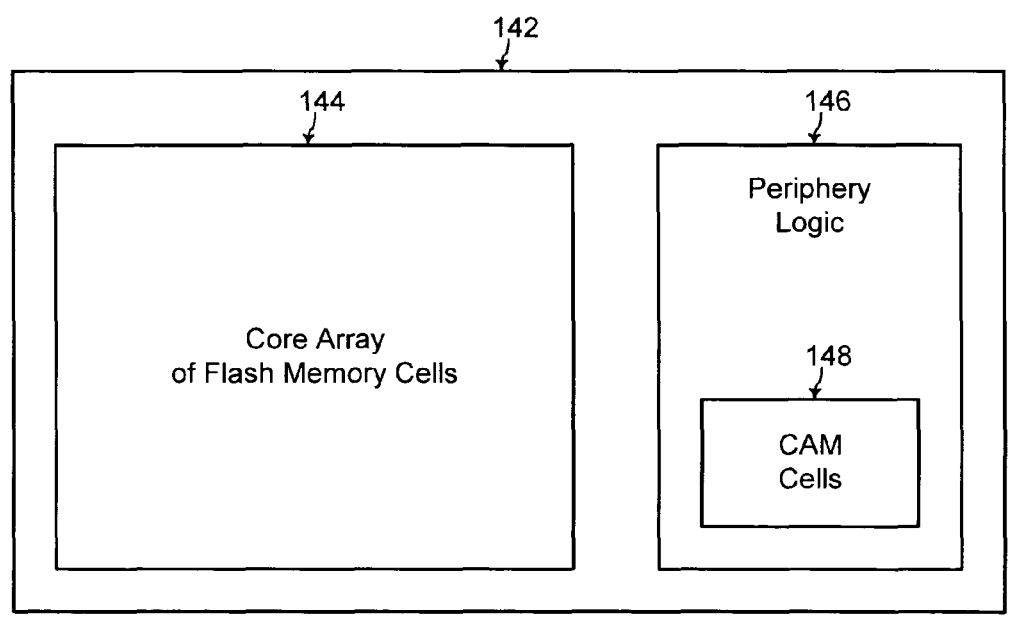
FIG. 5 shows an example semiconductor die with an array of core flash memory cells and periphery logic having WPCAM cells fabricated thereon, according to the prior art.
Figure 10:
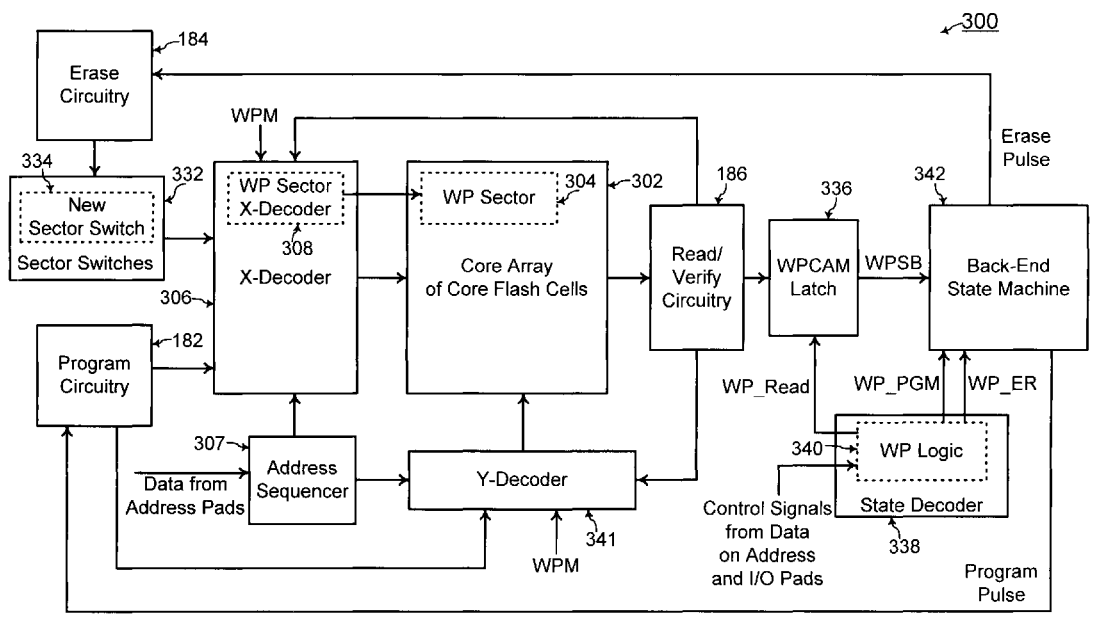
FIG. 10 shows a block diagram of a flash memory device with components used for accessing WPCAM (write protect content addressable memory) cells formed as core flash memory cells within an additional sector of the core array of the flash memory device, according to one embodiment of the present invention.

FIG. 10 shows a block diagram of a flash memory device 300 according to an embodiment of the present invention. The flash memory device 300 includes a core array of core flash memory cells 302 implemented similarly to the array of flash memory cells 130 of FIG. 3. In addition, the core array 302 includes an additional sector 304 (i.e., a WP (write protect) sector) of core flash memory cells to be used as WPCAM (write protect content addressable memory) cells.

The core flash memory cells of the WP sector 304 are part of the core array 302 in that the core flash memory cells of the WP sector 304 share the bit lines with the other core flash memory cells in the rest of the core array 302. In addition, the device dimensions and materials of the structure of each of the core flash memory cells of the WP sector 304 are similar with that of the other core flash memory cells in the rest of the core array 302, in one example embodiment of the present invention.

Figure 7:
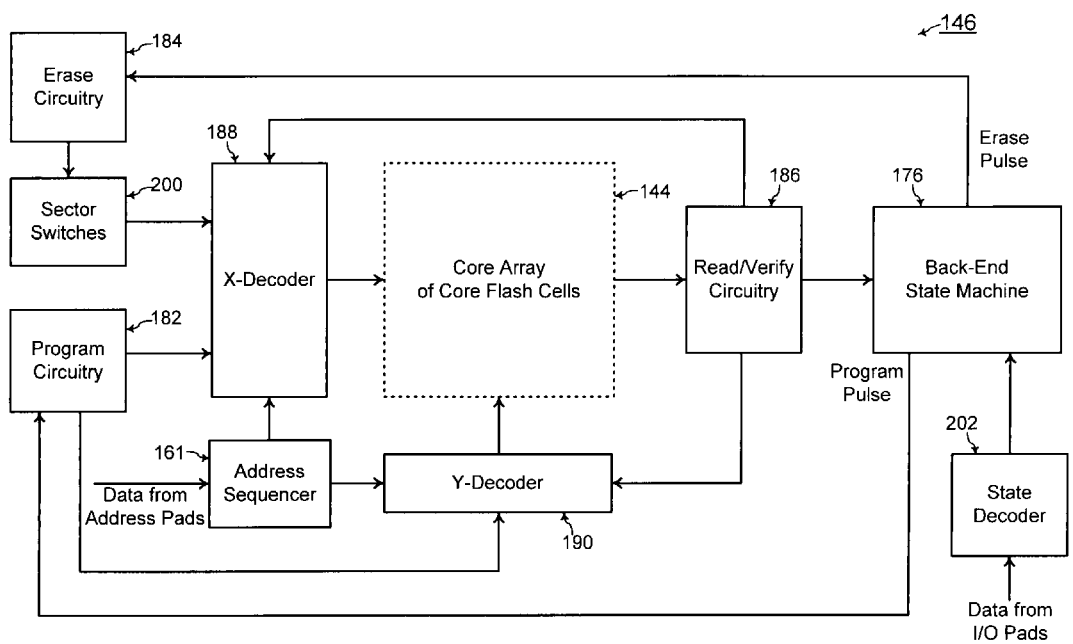
FIG. 7 shows components of the periphery logic for supporting use of the core flash memory cells within the core array, according to the prior art.

The flash memory device 300 includes the program circuitry 182, the erase circuitry 184, and the read/verify circuitry 186 which operate similarly as described in reference to FIG. 7. Furthermore, an X-decoder 306 of FIG. 10 operates similarly to the X-decoder 188 of FIG. 7, but the X-decoder 306 of FIG. 10 also includes an additional X-decoder unit (i.e., a WP sector X-decoder) 308.

Figure 13:
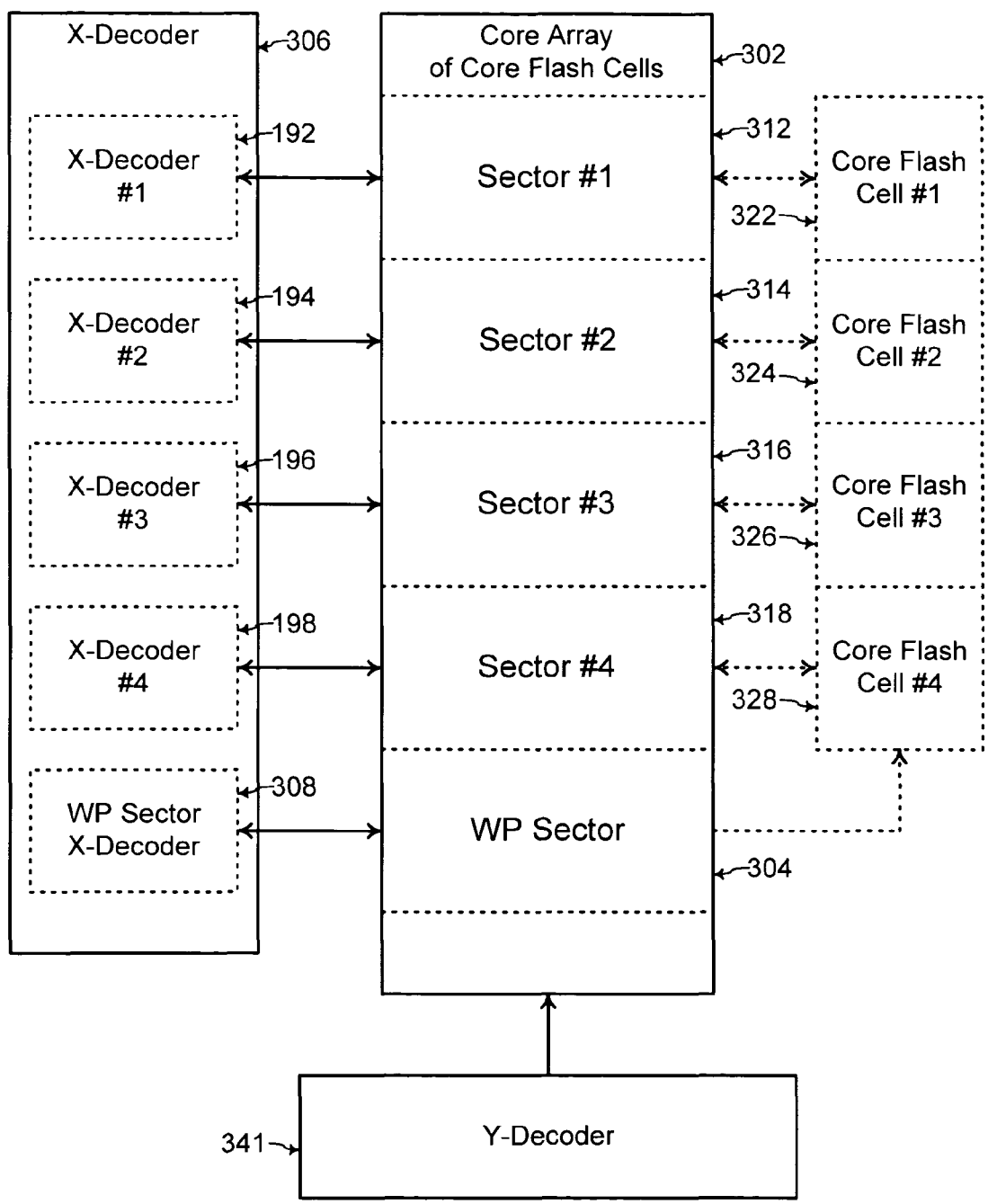
FIG. 13 shows an additional X-decoder unit formed for accessing a word-line within the additional sector of FIG. 10, according to one embodiment of the present invention.

Referring to FIGS. 10 and 13, the core array 302 is divided into a plurality of sectors including a first sector 312, a second sector 314, a third sector 316, and a fourth sector 318. Such sectors 312, 314, 316, and 318 comprise the traditional array of core flash memory cells of the flash memory device, as known to one of ordinary skill in the art of flash memory technology. In addition, the core array 302 according to an embodiment of the present invention includes the WP sector 304 having a respective core flash memory cell to be used as a WPCAM cell for each of the other sectors 312, 314, 316, and 318. Thus, the WP sector 304 includes a first core flash memory cell 322 to be used as the WPCAM cell for the first sector 312, a second core flash memory cell 324 to be used as the WPCAM cell for the second sector 314, a third core flash memory cell 326 to be used as the WPCAM cell for the third sector 316, and a fourth core flash memory cell 328 to be used as the WPCAM cell for the fourth sector 318.

Figure 8:
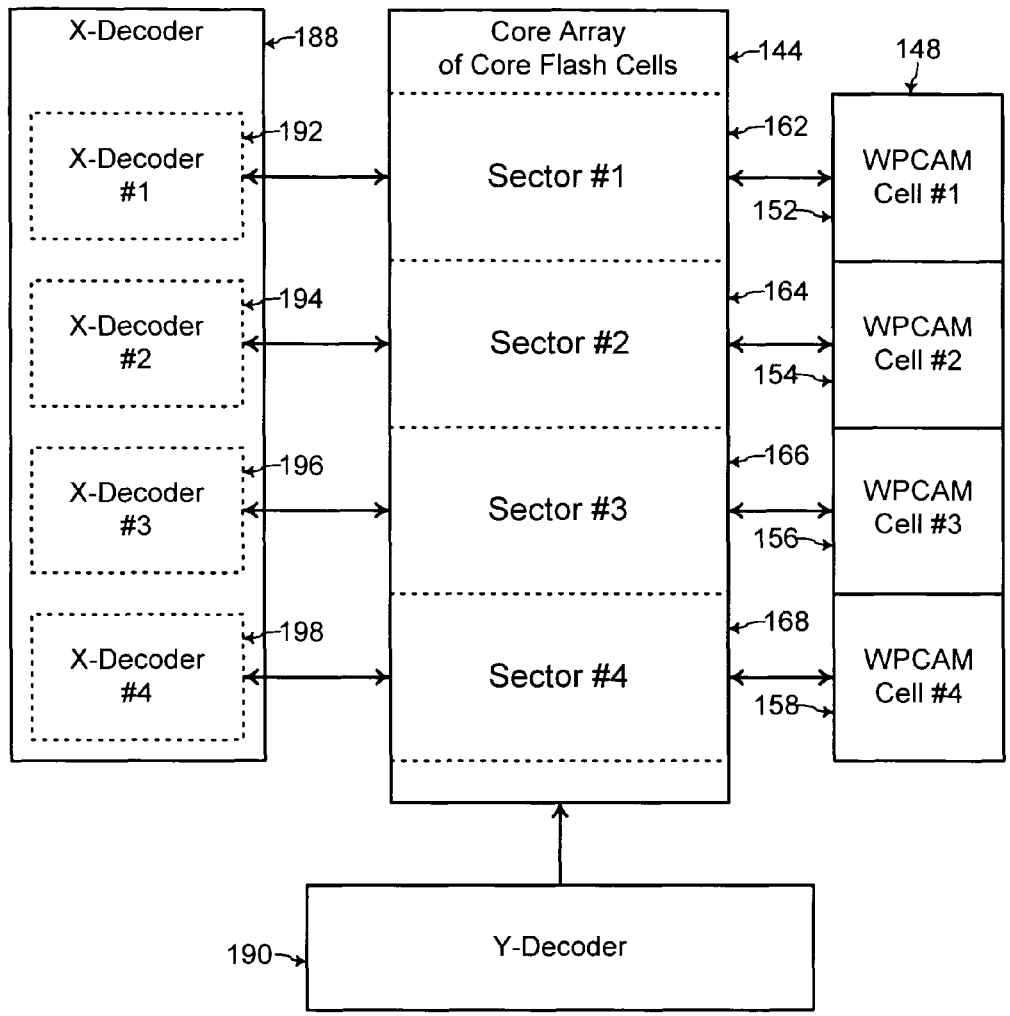
FIG. 8 shows a plurality of X-decoder units used for accessing word-lines of a plurality of sectors of the core array, according to the prior art.

The X-decoder 306 includes the first, second, third, and fourth X-decoder units 192, 194, 196, and 198 for decoding the X-address from an address sequencer 307 when selecting a word-line of a core flash memory cell of interest in the first, second, third, and fourth sectors, 312, 314, 316, and 318, respectively, similarly as described in reference to FIG. 8. In addition, the X-decoder 306 of an embodiment of the present invention also includes the additional X-decoder unit 308 that decodes the X-address from the address sequencer 307 when selecting a word-line of a core flash memory cell within the WP sector 304.

Because all of the sectors 312, 314, 316, 318, and 304 share the bit lines, a Y-decoder 341 decodes the Y-address from the address sequencer 307 for selecting a bit-line of a core flash memory cell within any of the sectors 312, 314, 316, 318, and 304, similarly as described for the Y-decoder 190 of FIG. 7. A flash memory device typically has more numerous sectors with correspondingly more numerous WPCAM cells and X-decoding units, but four sectors 312, 314, 316, and 318 are shown in FIG. 13 for simplicity and clarity of illustration and description.

Referring to FIG. 10, the flash memory device 300 includes sector switches 332 for gating an erasing gate voltage from the erase circuitry 184 to a selected sector of the sectors 312, 314, 316, and 318 of the core array 302, similarly as described for the sector switches 200 of FIG. 7. In addition, the sector switches 332 of FIG. 10 further include an additional sector switch (i.e., a WP sector switch) 334 for switching the erasing gate voltage from the erase circuitry 184 to the WP sector 304 when the selected sector to be erased is the WP sector 304.

The flash memory device 300 further includes a WPCAM latch 336 for storing the programmed or erased state read from a core flash memory cell within the WP sector 304. A state decoder 338 inputs control signals derived from data on I/O and address pads and determines a mode of operation for the flash memory device 300, similarly as described for the state decoder 202 of FIG. 7. However, the state decoder 338 of an embodiment of the present invention also includes additional WP (write protect) logic 340 for determining which one of the WP (write protect) operation modes is being invoked. The WP operation modes include WP_PGM (write protect program), WP_ER (write protect erase), and WP_Read (write protect read) for programming, erasing, and reading, respectively, a core flash memory cell as a WPCAM cell within the WP sector 304.

Figure 11:
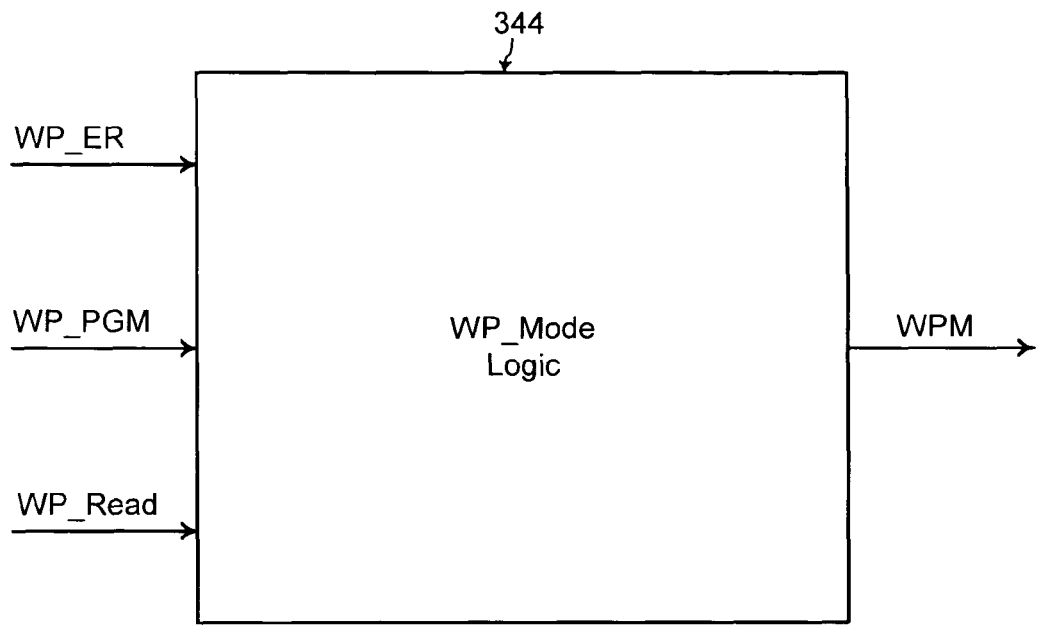
FIG. 11 shows additional write protect mode logic for generating a write protect mode signal used by components of FIG. 10, according to one embodiment of the present invention.

Furthermore, a back-end state machine 342 controls the operation of the program circuitry 182 and the erase circuitry 184 or inputs the read data from the read/verify circuitry depending on the WP operation mode to be performed, similarly as described for the back-end state machine 176 of FIG. 7. Referring to FIG. 11, the flash memory device 300 further includes WP_Mode (write protect mode) logic 344 for generating a WPM (write protect mode) signal that is input by the X-decoder 306 and the Y-decoder 341. The WP_Mode logic 344 may be implemented with an OR-gate that inputs the WP_ER, WP_PGM, or WP_Read signals.

The WPM signal indicates when a core flash memory cell within the WP sector 304 is being accessed for performing one of the WP_ER, WP_PGM, or WP_Read operations. When the WPM signal is asserted, the X-decoder 306 and the Y-decoder 341 are disabled from accessing any core flash memory cell outside of the WP sector 304.

Figure 9:
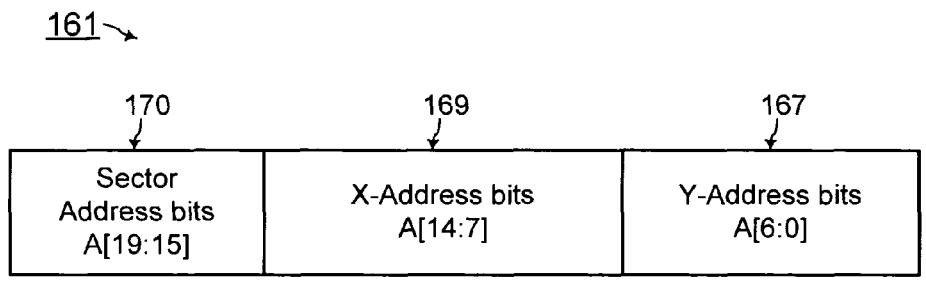
FIG. 9 shows address buffer bits of an address sequencer of FIGS. 7 and 8, according to the prior art.
Figure 12:
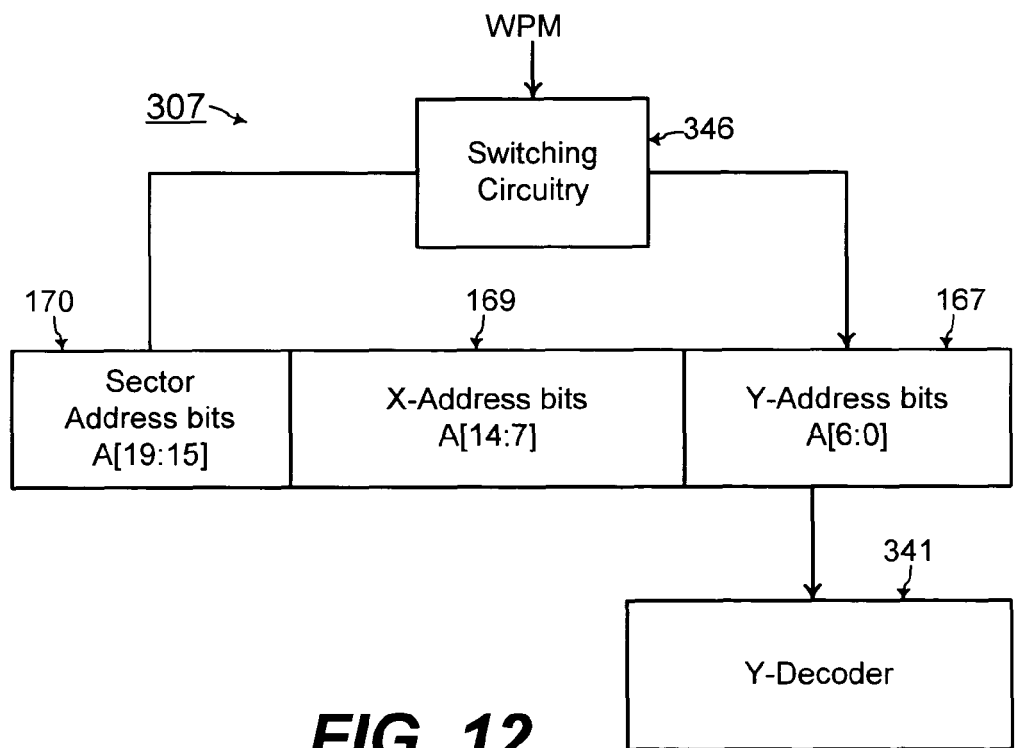
FIG. 12 illustrates switching of sector address bits to Y-address bits within the address sequencer for accessing a bit line of the additional sector of FIG. 10, according to one embodiment of the present invention.

In addition, referring to FIG. 12, an example address sequencer 307 includes sector address buffers 170 for the sector address bits A[19:15], X-address buffers 169 for the X-address bits A[14:7], and Y-address buffers 167 for the Y-address bits A[6:0], similarly as described in reference to the address sequencer 161 of FIG. 9. However, the address sequencer 307 of an embodiment of the present invention further includes switching circuitry 346 for gating the sector address bits A[19:15] to Y-address buffers 167 when the WPM signal is asserted.

Referring to FIGS. 12 and 13, each core flash memory cell within the WP sector 304 corresponds to one of the other sectors 312, 314, 316, and 318. If the core flash memory cells within the WP sector 304 are coupled to a same word-line but different bit lines, the sector address may be used for indicating the unique bit-line for each of the core flash memory cells within the WP sector 304. Thus, the switching circuitry 346 of FIG. 12 couples the sector address bits A[19:15] to Y-address buffers 167 when the WPM signal is asserted for indicating the bit-line of the WPCAM cell within the WP sector 304 corresponding to one of the other sectors 312, 314, 316, and 318 having that sector address.

Figure 14:
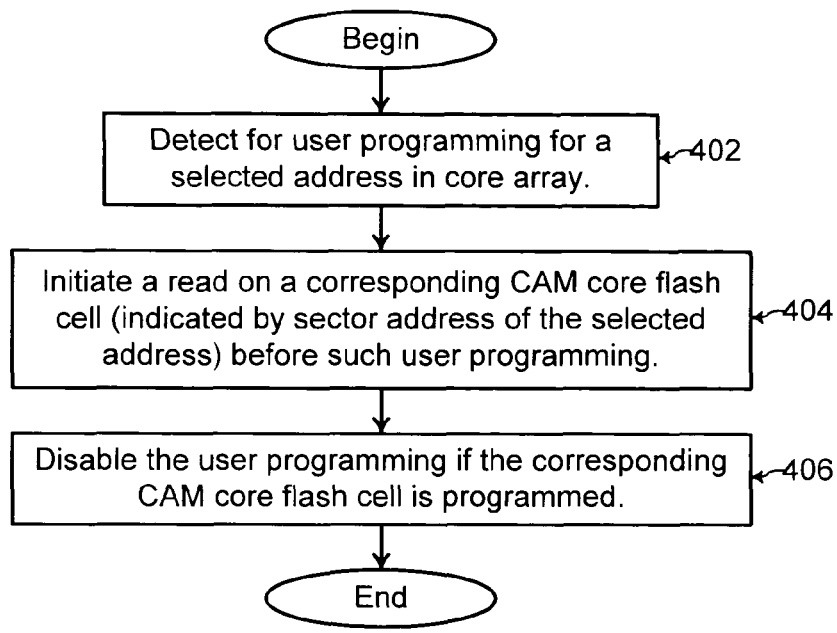
FIG. 14 shows a flow-chart of steps for accessing a WPCAM cell within the additional sector of FIG. 10 before user programming for a selected address in the core array, according to one embodiment of the present invention.

FIG. 14 shows a flowchart of steps during operation of the flash memory device 300 of FIG. 10 for user programming of a core flash memory cell of a selected address within the core array 302 but outside of the WP sector 304. The WP logic 340 detects that such a core flash memory cell outside of the WP sector 304 is desired to be programmed (step 402 of FIG. 14) from command entry data on the I/O pads. In addition, the selected address of such a core flash memory cell desired to be programmed is input to the address sequencer 307 via address pads.

Command entry technology for specifying programming of a core flash memory cell within a core array in general is known to one of ordinary skill in the art of flash memory technology. Before programming the selected core flash memory cell, the WP logic 340 asserts the WP_Read signal such that the WPCAM latch 336 latches in the programmed or erased state of a core flash memory cell used as the WPCAM cell within the WP sector 304 and corresponding to the sector of the selected address desired to be programmed (step 404 of FIG. 14).

Referring to FIGS. 10, 12, 13, and 14, the core flash memory cell desired to be programmed is within one of the other sectors 312, 314, 316, and 318. The sector address of such a core flash memory cell indicates the bit line of the WPCAM core flash memory cell within the WP sector 304 to be read. The reading gate voltage is applied on the gate of such a WPCAM core flash memory cell within the WP sector 304, and the drain of such a WPCAM core flash memory cell is coupled to a cascode sense amplifier within the read/verify circuitry 186. The programmed and erased state of such a WPCAM core flash memory cell as determined by the cascode sense amplifier is latched into the WPCAM latch 336.

The back-end state machine 342 inputs, as a WPSB (write protect state bit), the programmed and erased state as has been latched into the WPCAM latch 336. If the WPSB indicates a programmed state, the sector of the selected address of the core flash memory cell desired to be programmed is write protected. In that case, the back-end state machine does not generate any program pulse to disable programming for that sector of the selected address outside of the WP sector 304 (step 406 of FIG. 14). On the other hand, if the WPSB indicates an erased state, the sector of the selected address of the core flash memory cell desired to be programmed is not write protected. In that case, the back-end state machine generates the program pulse to enable programming of the core flash memory cell of the selected address outside of the WP sector 304.

Figure 15:
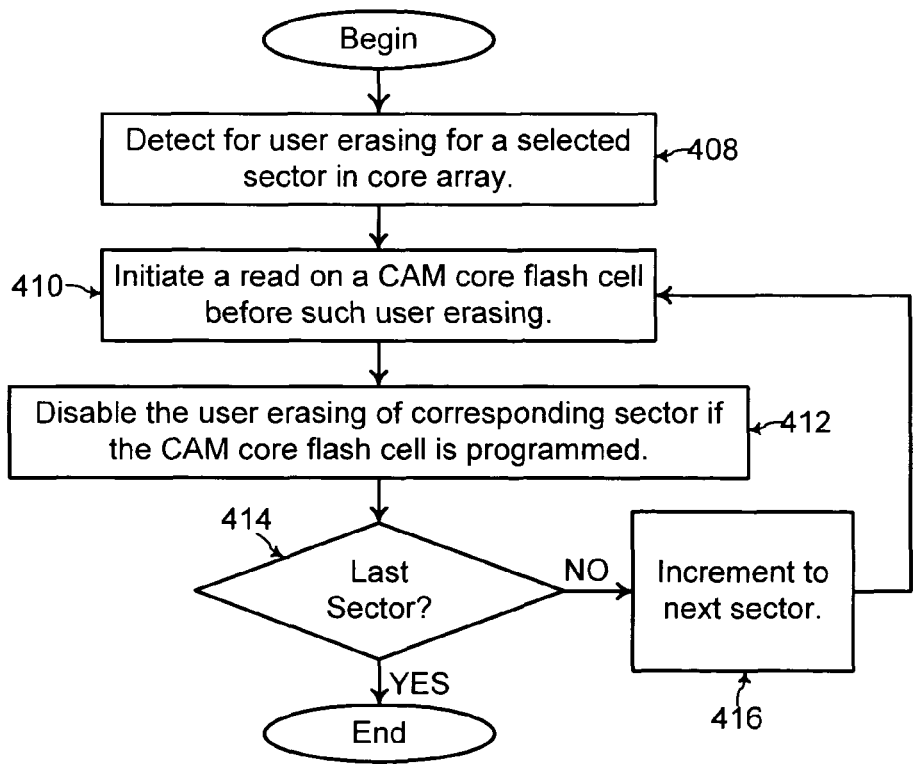
FIG. 15 shows a flow-chart of steps for accessing a WPCAM cell within the additional sector of FIG. 10 before user erasing for a selected sector in the core array, according to one embodiment of the present invention.

Similarly, FIG. 15 shows a flowchart of steps during operation of the flash memory device 300 of FIG. 10 for user erasing of a selected sector of the other sectors 312, 314, 316, and 318 outside of the WP sector 304. The WP logic 340 detects that such a selected sector outside of the WP sector 304 is desired to be erased (step 408 of FIG. 15) from command entry data on the I/O and address pads. Command entry technology for specifying erasing of a selected sector within a core array in general is known to one of ordinary skill in the art of flash memory technology. In that case, the WP logic 340 asserts the WP_Read signal such that the WPCAM latch 336 latches in the programmed or erased state of a core flash memory cell used as the WPCAM cell within the WP sector 304 (step 410 of FIG. 15).

In an example embodiment of the present invention, all of the core flash memory cells used as WPCAM cells within the WP sector 304 are read for determining which of the other sectors 312, 314, 316, and 318 is not write protected and may be erased. Thus, a WPCAM core flash memory cell within the WP sector 304 is read (step 410) by the WPSB latched into the WPCAM latch 336 for that WPCAM core flash memory cell. If the WPSB indicates a programmed state, user erasing for the corresponding one of the other sectors 312, 314, 316, or 318 is disabled by the back-end state machine (step 412 of FIG. 15).

On the other hand, if the WPSB indicates an erased state, each core flash memory cell within the corresponding one of the other sectors 312, 314, 316, or 318 may be erased. Typically, a whole sector of flash memory cells of the core array 302 is erased during an erase operation of the flash memory device.

In any case, after reading the programmed or erased state for a WPCAM core flash memory cell within the WP sector 304, if the WPCAM core flash memory cell for all of the other sectors 312, 314, 316, or 318 has not been read (step 414), the address sequencer 307 increments to a next sector such that another WPCAM core flash memory cell corresponding to the next sector may be read. Steps 410, 412, 414, and 416 of FIG. 15 are repeated for determining whether each of the other sectors 312, 314, 316, or 318 is write-protected or not write-protected. Thus, each flash memory cell of the selected sector outside of the WP sector 304 desired to be erased is erased if the selected sector is not write-protected.

Figure 16:
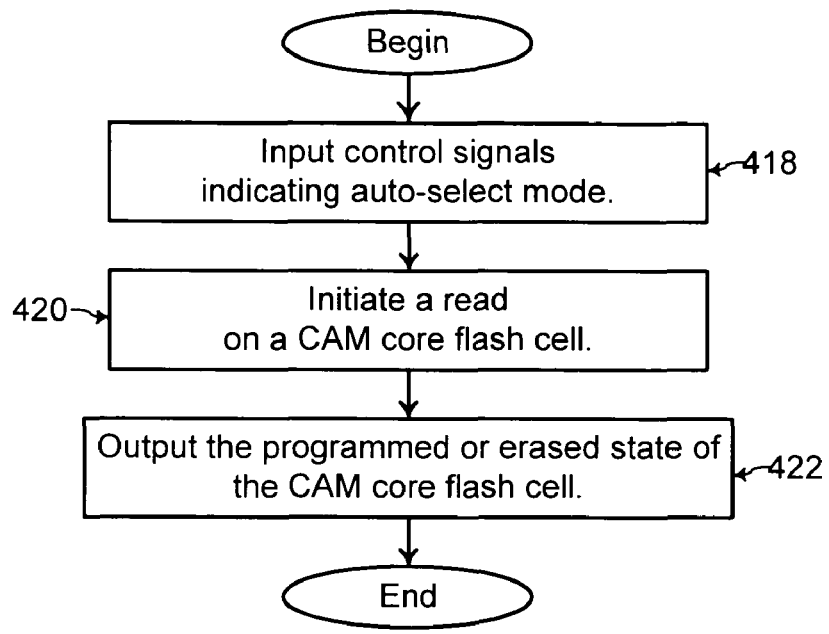
FIG. 16 shows a flow-chart of steps for accessing the WPCAM cells within the additional sector of FIG. 10 during auto-select mode, according to one embodiment of the present invention.

FIG. 16 shows a flowchart of steps during operation of the flash memory device 300 of FIG. 10 for an auto-select mode. During the auto-select mode, the programmed or erased state of a selected WPCAM core flash memory cell within the WP sector 304 is read. The WP logic 340 detects that the auto-select mode is invoked (step 418 of FIG. 16) from command entry data on the I/O and address pads. The address of the selected WPCAM core flash memory cell within the WP sector 304 is input to the address sequencer 307 via the address pads. Command entry technology for specifying an operation mode is known to one of ordinary skill in the art of flash memory technology.

In that case, the WP logic 340 asserts the WP_Read signal such that the WPCAM latch 336 latches as the WPSB the programmed or erased state of the selected WPCAM core flash memory cell within the WP sector 304 (step 420 of FIG. 16). The WPSB bit indicating the programmed or erased state for the selected WPCAM core flash memory cell is output via I/O pads for the auto-select mode (step 422 of FIG. 16).

Figure 17:
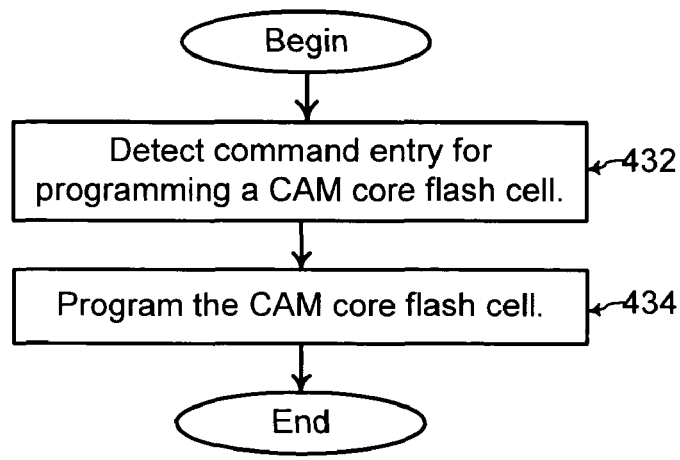
FIG. 17 shows a flow-chart of steps for programming a WPCAM cell within the additional sector, according to one embodiment of the present invention.

FIG. 17 shows a flowchart of steps during operation of the flash memory device 300 of FIG. 10 for user programming of a WPCAM core flash memory cell within the WP sector 304. The WP logic 340 detects that such a WPCAM core flash memory cell within the WP sector 304 is desired to be programmed (step 432 of FIG. 17) from command entry data on the I/O pads. In that case, the WP logic 340 asserts the WP_PGM signal such that the back-end state machine 342 controls the program circuitry 182 to program the WPCAM core flash memory cell (step 434 of FIG. 17).

The address of the WPCAM core flash memory cell within the WP sector 304 desired to be programmed is input into the address sequencer 307 via address pads. Command entry technology for specifying programming of a selected core flash memory cell within a core array in general is known to one of ordinary skill in the art of flash memory technology.

Figure 18:
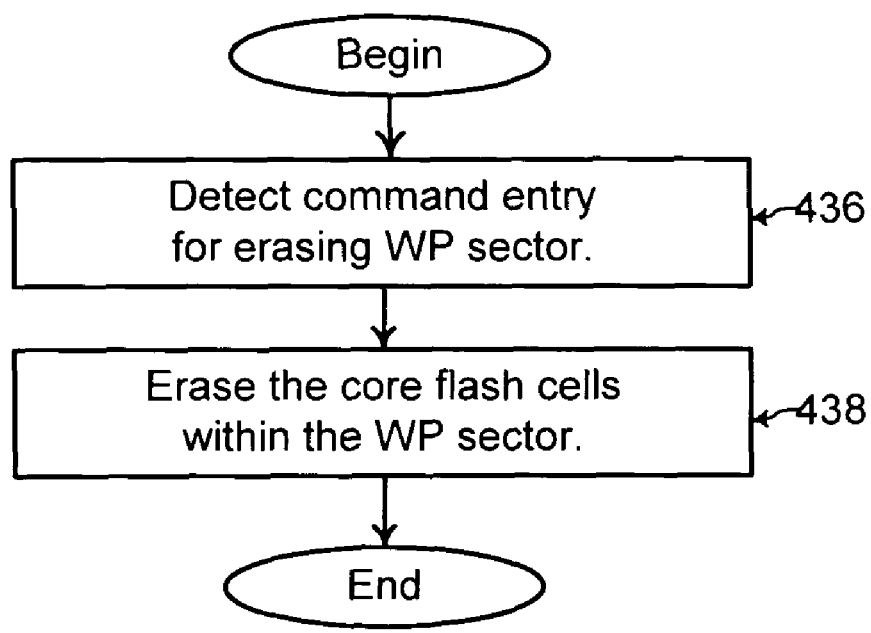
FIG. 18 shows a flow-chart of steps for erasing a WPCAM cell within the additional sector, according to one embodiment of the present invention.

FIG. 18 shows a flowchart of steps during operation of the flash memory device 300 of FIG. 10 for user erasing of the WP sector 304. The WP logic 340 detects that the WP sector 304 is desired to be erased (step 436 of FIG. 18) from command entry data on the I/O pads. In that case, the WP logic 340 asserts the WP_ER signal such that the back-end state machine 342 controls the erase circuitry 184 to erase the WPCAM core flash memory cells within the WP sector 304 (step 438 of FIG. 18). Command entry technology for specifying erasing of a selected sector within a core array in general is known to one of ordinary skill in the art of flash memory technology.

In this manner, WPCAM functionality is provided by core flash memory cells fabricated within the WP sector 304 as part of the core array 302. Referring to FIG. 10, the WPCAM cells within the WP sector 304 are accessed by components for accessing the core array 302. In addition, the programming, erasing, and reading operations for the WPCAM cells within the WP sector 304 are performed by components for performing such operations on the core array 302.

Figure 6:
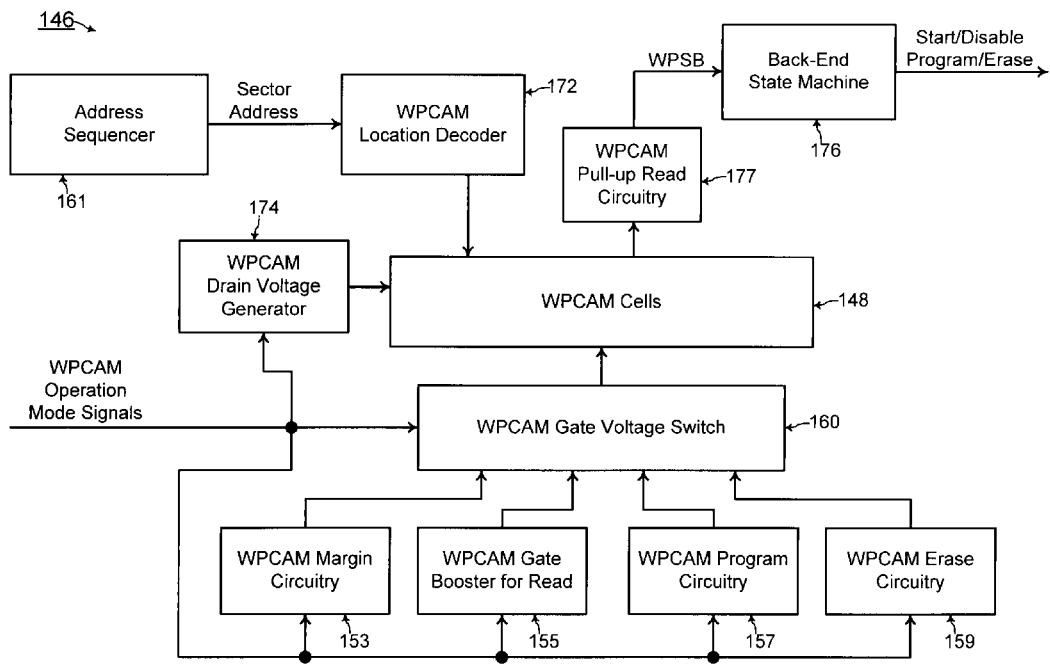
FIG. 6 shows components of the periphery logic for supporting operation of the WPCAM cells, according to the prior art.

Thus, the components 153, 155, 157, 159, 161, 172, 174, and 177 of the periphery logic 146 of FIG. 6 for performing such operations on the separate WPCAM cells 148 of the prior art are eliminated with the present invention for a minimized number of components for providing WPCAM functionality. Such a minimized number of components simplifies circuit design of the flash memory device and minimizes the area occupied by the flash memory device. Furthermore, because the WPCAM cells are implemented as part of the core array 302, the traditional separate WPCAM cells 148 of FIG. 6 are eliminated with the embodiment of the present invention for further minimizing the area occupied by the flash memory device.

In addition, because the WPCAM cells are implemented as core flash memory cells of the core array, the WPCAM cells may reliably undergo more numerous programming and erasing cycles. Traditional WPCAM cells that are optimized for charge retention typically reliably support approximately one hundred programming and erasing cycles of such WPCAM cells. However, because core flash memory cells of the core array 302 are optimized for numerous programming and erasing cycles (such as millions of programming and erasing cycles for example), the WPCAM cells that are implemented as core flash memory cells of the core array 302 may reliably undergo more numerous programming and erasing cycles.

The foregoing is by way of example only and is not intended to be limiting. For example, the present invention is described in reference to WPCAM (write protect content addressable memory) cells used for WP (write protect) functionality. However, the present invention may be used for implementing CAM (content addressable memory) cells used for other CAM functionalities within the flash memory device, as would be apparent to one of ordinary skill in the art of flash memory technology from the description herein.

In addition, the present invention may be practiced with various implementations of the components 304, 306, 307, 308, 332, 334, 336, 338, 340, 341, 342, 344, 346 of FIGS. 10, 11, 12, and 13 such as by hardware and/or software for performing the functions described herein. Furthermore, any numbers of elements as illustrated and described herein are by way of example only. The present invention is limited only as defined in the following claims and equivalents thereof.

We claim:

1. A method of providing a CAM (content addressable memory) cell of a flash memory device, including the steps of:
   fabricating a respective core flash memory cell, to be used as the CAM cell, as part of a core array of the flash memory device; and
   accessing the respective core flash memory cell as the CAM cell for a CAM function within the flash memory device.

2. The method of claim 1, further including the step of:
   fabricating an additional sector as part of the core array of the flash memory device to include the respective core flash memory cell used as the CAM cell.

3. A method of providing a CAM (content addressable memory) cell of a flash memory device, including the steps of:
   fabricating a respective core flash memory cell, to be used as the CAM cell, as part of a core array of the flash memory device,
   accessing the respective core flash memory cell as the CAM cell for a CAM function within the flash memory device;
   fabricating an additional sector as part of the core array of the flash memory device to include the respective core flash memory cell used as the CAM cell; and
   fabricating within the additional sector a plurality of core flash memory cells, each to be used as a respective CAM cell within the flash memory device.

4. The method of claim 3, further including the step of:
   fabricating an additional X-decoder for decoding X-address data during accessing of a word-line of the additional sector.

5. The method of claim 3, wherein each core flash memory cell within the additional sector corresponds to one of a plurality of other sectors of the flash memory device, and wherein the method further includes the step of:
   using sector address bits as Y-address bits that are decoded during accessing of a bit line of the additional sector.

6. The method of claim 5, wherein the sector address bits are decoded with a Y-decoder used for accessing a bit line of the other sectors.

7. The method of claim 3, wherein whether each of the core flash memory cells within the additional sector is programmed or erased indicates whether a corresponding one of a plurality of other sectors is write-protected for write protect (WP) functionality.

8. The method of claim 7, further including the steps of:
   generating a control signal to initiate a read on a core flash memory cell within the additional sector before user programming for a selected address within a selected sector of the other sectors;
   using a sector address of the selected address to indicate which core flash memory cell within the additional sector is to be read;
   reading the programmed or erased state of the core flash memory cell used as a CAM cell corresponding to the selected sector; and
   disabling user programming if the core flash memory cell used as the CAM cell corresponding to the selected sector is programmed.

9. The method of claim 8, wherein the step of reading is performed by read/verify circuitry that is also used for reading core flash memory cells of the other sectors.

10. The method of claim 7, further including the steps of:
    generating a control signal to initiate a read on a core flash memory cell within the additional sector before user erasing for a selected sector of the other sectors;
    using the sector address of the selected sector to indicate which core flash memory cell within the additional sector is to be read;
    reading the programmed or erased state of the core flash memory cell used as a CAM cell corresponding to the selected sector; and
    disabling user erasing if the core flash memory cell used as the CAM cell corresponding to the selected sector is programmed.

11. The method of claim 10, wherein the step of reading is performed by read/verify circuitry that is also used for reading core flash memory cells of the other sectors.

12. The method of claim 10, wherein the programmed or erased state of each of the core flash memory cells within the additional sector is read to determine which of the other sectors may be erased.

13. The method of claim 7, further including the steps of:
    inputting a control signal indicating auto-select mode for reading the programmed or erased state of a selected core flash memory cell within the additional sector; and
    reading and outputting the programmed or erased state of the selected core flash memory cell.

14. The method of claim 13, wherein the step of reading is performed by read/verify circuitry that is also used for reading core flash memory cells of the other sectors.

15. The method of claim 7, further including the steps of:
    detecting command entry for programming a selected core flash memory cell within the additional sector; and
    programming the selected core flash memory cell within the additional sector upon the detection of the command entry for programming the selected core flash memory cell.

16. The method of claim 15, wherein the step of programming is performed by program circuitry that is also used for programming core flash memory cells of the other sectors.

17. The method of claim 7, further including the steps of:
    detecting command entry for erasing the additional sector; and
    erasing the core flash memory cells within the additional sector upon the detection of the command entry for erasing the additional sector.

18. The method of claim 17, wherein the step of erasing is performed by erase circuitry that is also used for erasing core flash memory cells of the other sectors.

19. A system for providing a CAM (content addressable memory) cell of a flash memory device, comprising:
- a respective core flash memory cell fabricated as part of a core array of the flash memory device and to be used as the CAM cell;
- a Y-decoder for accessing a bit line of the core array of the flash memory device including a bit line of the respective core flash memory cell used as the CAM cell; and
- an X-decoder for accessing a word-line of the respective core flash memory cell used as the CAM cell for a CAM function within the flash memory device.

20. A system for providing a CAM (content addressable memory) cell of a flash memory device, comprising:
- a respective core flash memory cell fabricated as part of a core array of the flash memory device and to be used as the CAM cell;
- a Y-decoder for accessing a bit line of the core array of the flash memory device including a bit line of the respective core flash memory cell used as the CAM cell;
- an X-decoder for accessing a word-line of the respective core flash memory cell used as the CAM cell for a CAM function within the flash memory device;
- an additional sector fabricated as part of the core array of the flash memory device to include the respective core flash memory cell used as the CAM cell; and
- an additional X-decoder unit for accessing a word-line of the additional sector.

21. The system of claim 20, wherein the additional sector includes a plurality of core flash memory cells, each to be used as a respective CAM cell within the flash memory device.

22. The system of claim 21, wherein each core flash memory cell within the additional sector corresponds to one of a plurality of other sectors of the flash memory device.

23. The system of claim 22, wherein the Y-decoder decodes sector address bits as Y-address bits during access of a bit line of the additional sector.

24. The system of claim 22, wherein whether each of the core flash memory cells within the additional sector is programmed or erased indicates whether a corresponding one of the other sectors is write-protected for write protect (WP) functionality.

25. The system of claim 24, further comprising:
- write protect operation logic for detecting entry into one of write protect read, write protect program, and write protect erase operations.

26. The system of claim 25,
- wherein the write protect operation logic generates a control signal to initiate a read on a core flash memory cell within the additional sector before user programming for a selected address within a selected sector of the other sectors;
- and wherein the Y-decoder uses the sector address of the selected address to indicate which core flash memory cell within the additional sector is to be read;
- the system further comprising:
- read/verify circuitry and a latch for reading the programmed or erased state of the core flash memory cell used as a CAM cell corresponding to the selected sector; and
- a back-end state machine for disabling user programming if the core flash memory cell used as the CAM cell corresponding to the selected sector is programmed.

27. The system of claim 26, wherein the read/verify circuitry is also used for reading core flash memory cells of the other sectors.

28. The system of claim 25,
- wherein the write protect operation logic generates a control signal to initiate a read on a core flash memory cell within the additional sector before user erasing for a selected sector of the other sectors;
- and wherein the Y-decoder uses the sector address of the selected sector to indicate which respective core flash memory cell within the additional sector is to be read;
- the system further comprising:
- read/verify circuitry and a latch for reading the programmed or erased state of the core flash memory cell used as a CAM cell corresponding to the selected sector; and
- a back-end state machine for disabling user erasing if the core flash memory cell used as the CAM cell corresponding to the selected sector is programmed.

29. The system of claim 28, wherein the read/verify circuitry is also used for reading core flash memory cells of the other sectors.

30. The system of claim 25,
- wherein the write protect operation logic inputs a control signal indicating auto-select mode for reading the programmed or erased state of a selected core flash memory cell within the additional sector;
- the system further comprising:
- read/verify circuitry and a latch for reading and outputting the programmed or erased state of the selected core flash memory cell.

31. The system of claim 30, wherein the read/verify circuitry is also used for reading core flash memory cells of the other sectors.

32. The system of claim 25,
- wherein the write protect operation logic detects command entry for programming a selected core flash memory cell within the additional sector;
- the system further comprising:
- program circuitry for programming the selected core flash memory cell upon the detection of the command entry for programming the selected core flash memory cell.

33. The system of claim 32, wherein the program circuitry is also used for programming core flash memory cells of the other sectors.

34. The system of claim 25,
- wherein the write protect operation logic detects command entry for erasing the additional sector;
- the system further comprising:
- erase circuitry for erasing the core flash memory cells within the additional sector upon the detection of the command entry for erasing the additional sector.

35. The system of claim 34, wherein the erase circuitry is also used for erasing core flash memory cells of the other sectors.

* * * * *